(12) United States Patent
Shieh et al.

(10) Patent No.: US 9,443,768 B2
(45) Date of Patent: *Sep. 13, 2016

(54) METHOD OF MAKING A FINFET DEVICE

(71) Applicant: Taiwan Semiconductor Manufacturing Company, Ltd., Hsin-Chu (TW)

(72) Inventors: Ming-Feng Shieh, Yongkang (TW); Hung-Chang Hsieh, Hsin-Chu (TW); Han-Wei Wu, Tainan (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/710,995

(22) Filed: May 13, 2015

(65) Prior Publication Data

US 2015/0249039 A1     Sep. 3, 2015

Related U.S. Application Data

(63) Continuation of application No. 14/088,861, filed on Nov. 25, 2013, now Pat. No. 9,034,723.

(51) Int. Cl.

| H01L 21/76 | (2006.01) |
|---|---|
| H01L 21/8234 | (2006.01) |
| H01L 21/308 | (2006.01) |
| H01L 21/306 | (2006.01) |
| H01L 21/3105 | (2006.01) |
| H01L 29/66 | (2006.01) |

(52) U.S. Cl.
CPC ... *H01L 21/823431* (2013.01); *H01L 21/3086* (2013.01); *H01L 21/3088* (2013.01); *H01L 21/30604* (2013.01); *H01L 21/31055* (2013.01); *H01L 29/66795* (2013.01)

(58) Field of Classification Search
USPC ................................................ 438/424, 696
See application file for complete search history.

(56) References Cited

U.S. PATENT DOCUMENTS

| 8,039,179 | B2 | 10/2011 | Shieh et al. |
|---|---|---|---|
| 8,202,681 | B2 | 6/2012 | Lin et al. |
| 8,728,332 | B2 | 5/2014 | Lin et al. |
| 8,822,243 | B2 | 9/2014 | Yan et al. |
| 8,906,807 | B2 | 12/2014 | Bergendahl et al. |
| 8,932,957 | B2 | 1/2015 | Shieh et al. |
| 2006/0091468 | A1 | 5/2006 | Liaw |
| 2011/0127610 | A1 | 6/2011 | Lee et al. |
| 2011/0281208 | A1 | 11/2011 | Lin et al. |
| 2012/0278776 | A1 | 11/2012 | Lei et al. |

(Continued)

*Primary Examiner* — Timor Karimy
(74) *Attorney, Agent, or Firm* — Haynes and Boone, LLP (57) ABSTRACT

A method of fabricating a fin-like field-effect transistor (FinFET) device includes providing a substrate having a first region and a second region, and forming a plurality of mandrel features in the first region with a first spacing. The method further includes forming first spacers along sidewalls of the mandrel features with a targeted width A, and forming second spacers with a first width $W_1$ along sidewalls of the first spacers, wherein two back-to-back adjacent second spacers are separated by a gap. The method further includes depositing a dielectric material in the gap and in the second region, and performing a first cut thereby removing a first subset of the first spacers. Coincident with the removing of the first subset, the method further includes partially removing the dielectric material in the second region thereby forming a mesa of the dielectric material in the second region.

20 Claims, 13 Drawing Sheets

(56) References Cited

U.S. PATENT DOCUMENTS

| | | |
|---|---|---|
| 2013/0134486 A1 | 5/2013 | LiCausi |
| 2013/0196508 A1 | 8/2013 | LiCausi |
| 2013/0295769 A1 | 11/2013 | Lin et al. |
| 2013/0320451 A1 | 12/2013 | Liu et al. |
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |

METHOD OF MAKING A FINFET DEVICE

PRIORITY DATA

This application is a continuation of U.S. application Ser. No. 14/088,861, filed on Nov. 25, 2013, and entitled "METHOD OF MAKING A FINFET DEVICE," the entirety of which is hereby incorporated by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of fabricating FinFET devices have been generally adequate for their intended purposes, they have not been entirely satisfactory in all respects. For example, a more flexible integration for forming fin and isolation structures is desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

Figure 1:
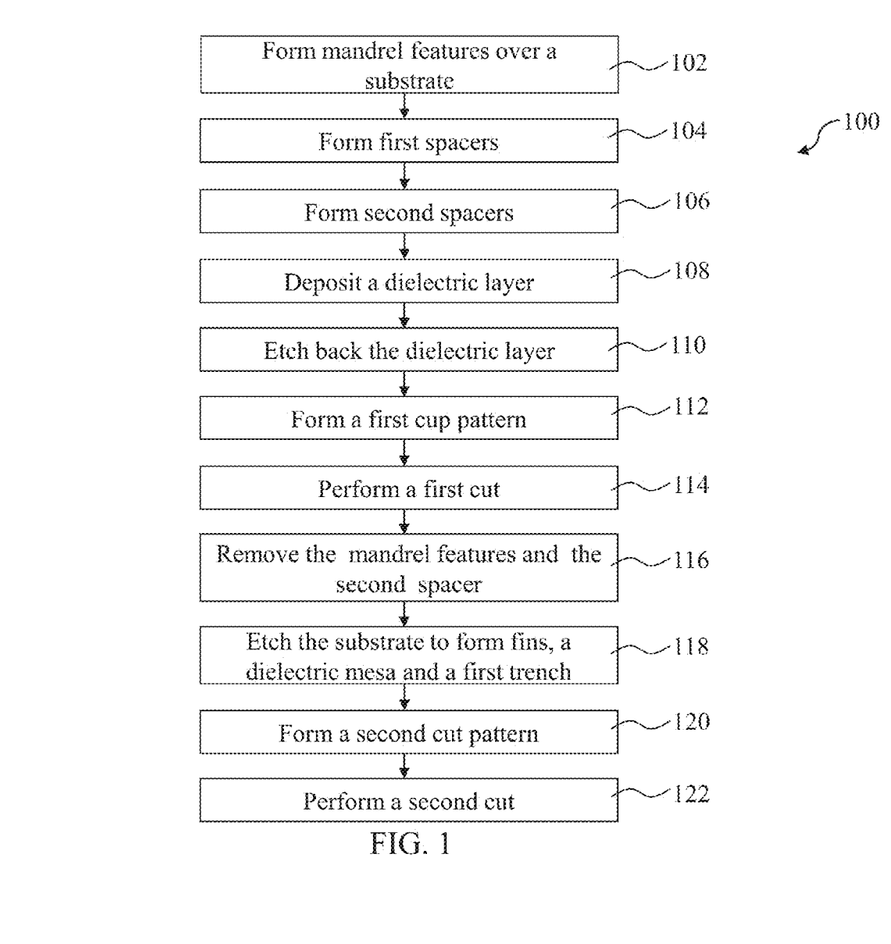
FIG. 1 is a flow chart of an example method for fabricating a semiconductor device according to various aspects of the present disclosure.

FIG. 1 is a flowchart of a method 100 for fabricating a FinFET device according to aspects of the present disclosure. It is understood that additional steps can be provided before, during, and after the method, and some of the steps described can be replaced or eliminated for other embodiments of the method. The method 100 is discussed in detail below, with reference to a FinFET device 200 shown in FIGS. 2 to 13 for the sake of example. The present disclosure repeats reference numerals and/or letters in the various embodiments. This repetition is for the purpose of simplicity and clarity and does not in itself dictate a relationship between the various embodiments and/or configurations discussed.

Figure 2:
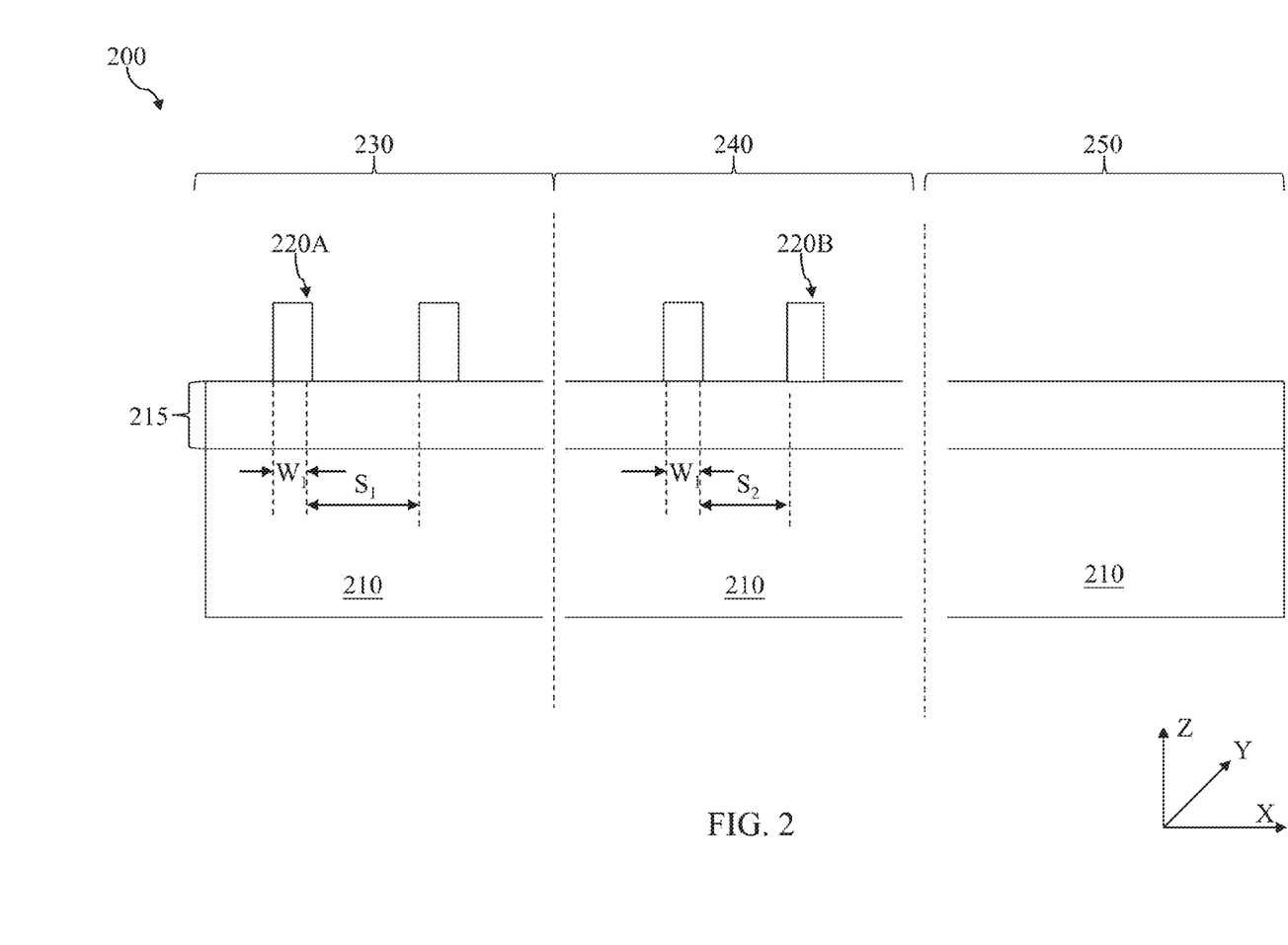
FIGS. 2-13 are cross-sectional views of an example semiconductor device at fabrication stages constructed according to the method of FIG. 1.

Referring to FIGS. 1 and 2, the method 100 begins at step 102 by forming a plurality of mandrel features 220 on a substrate 210. Each mandrel feature 220 is a dummy feature and will be removed at a later fabrication stage. Individual mandrel features will be labeled 220A, 220B, etc. for the sake of further reference, below.

The substrate 210 includes a semiconductor substrate, such as a silicon wafer. Alternatively, the substrate 210 includes germanium, silicon germanium or other proper semiconductor materials. In one embodiment, the substrate 210 includes an epitaxy (or epi) semiconductor layer. In another embodiment, the substrate 210 includes a buried dielectric material layer for isolation formed by a proper technology, such as a technology referred to as separation by implanted oxygen (SIMOX). In some embodiments, the substrate 210 may be a semiconductor on insulator, such as silicon on insulator (SOI).

The substrate 210 may include various doped regions depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

In one embodiment, prior to forming the mandrel features 220, a hard mask 215 is formed over the substrate 210 to provide protection to a fin structure in subsequent processes. The hard mask 215 may include multiple layers to gain process flexibility. For example, the hard mask 215 includes a first oxide layer deposited over the substrate 210, a silicon nitride layer deposited over the first oxide layer and a second silicon oxide layer deposited over the silicon nitride layer. One or more of the layers may be formed by various methods, including thermal oxidation, a chemical vapor deposition (CVD) process, plasma enhanced CVD (PECVD), atomic layer deposition (ALD), and/or other methods known in the art.

In the present embodiment, the substrate 210 has three regions: a first region 230, a second region 240 and a third region 250. The mandrel features 220 are then formed over the hard mask 215 in the first and the second regions. In one embodiment, the mandrel features 220 are formed by depositing a mandrel material layer, such as a dielectric material (silicon oxide, silicon nitride for examples); forming a patterned photo resist layer over the mandrel material layer; and etching the mandrel material layer using the patterned resist layer as an etch mask, thereby forming the mandrel features 220. In another embodiment, the mandrel features 220 are resist patterns.

The mandrel features 220 are oriented in the Y direction and spaced away in the X direction perpendicular to the Y direction. The mandrel features 220 are characterized with a width L and a first spacing S. The width L and the first spacing S may be a constant or alternatively be a variable that changes from mandrel feature to mandrel feature. For the sake of clarity to better describing the method 100, now labeling the mandrel features 220 in the first region 230 and second region 240 with the reference number 220A and 220B, respectively.

In the present embodiment, the mandrel features 220A and 220B have the same width, a first width $W_1$, but have different spacing. In the first region, the mandrel features 220A have a first spacing $S_1$ and in the second region, the mandrel features 220B have a second spacing $S_2$. With a targeted width of fin features, the first spacing $S_1$ is designed be equal to $(2 \times W_1)+(3 \times A)$, where A is the width of a fin to be formed, which will be described in detail below. The second spacing $S_2$ is designed to be less than or equal to $(2 \times W_1)+(2 \times A)$, and larger than $2 \times A$, which will also be described in detail below.

Figure 3:
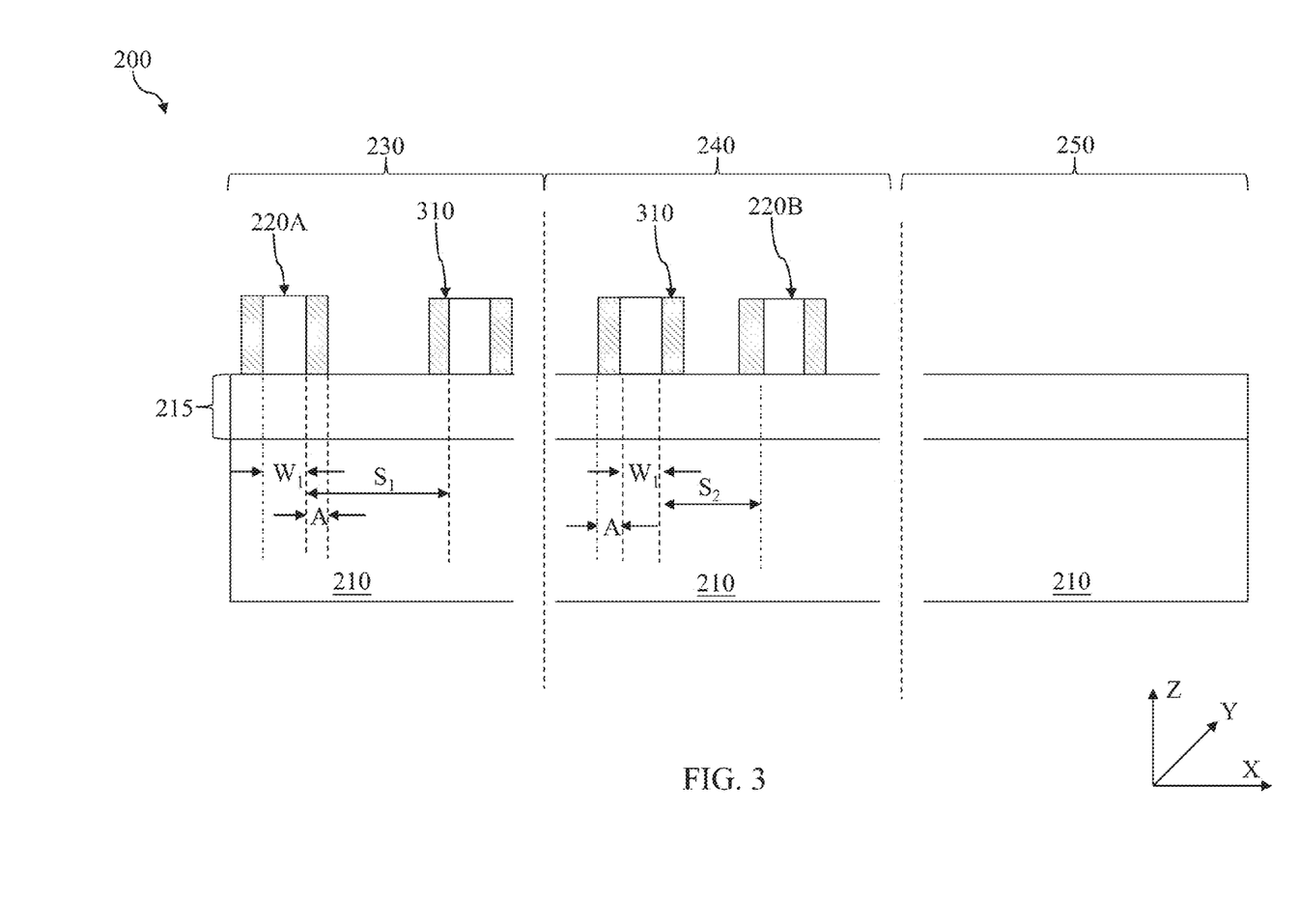

Referring to FIGS. 1 and 3, the method 100 proceeds to step 104 by forming a first spacer 310 on sidewalls of the mandrel features 220. In one embodiment, the formation of the first spacer 310 includes depositing a first spacer material layer on the substrate 210 and the mandrel features 220, and thereafter performing a first anisotropic etch to the first spacer material layer, thereby forming the first spacer 310. The first spacer material layer may include a dielectric material (such as silicon oxide, silicon nitride or silicon carbide) but is different from the mandrel material layer to achieve etching selectivity during the first anisotropic etch. The deposition of the first spacer material layer includes a suitable technique, such as chemical vapor deposition (CVD). The first anisotropic etch may include a plasma etch in one example. The first spacer 310 is oriented in the Y direction and spaced from each other in the X direction.

In the present embodiment, the first spacer 310 is formed with the same width as the fin, which is the targeted width A. In one embodiment, a thickness of the first spacer material along sidewalls of the mandrel features, 220A and 220B, is controlled to be the same as the targeted width A.

Figure 4:
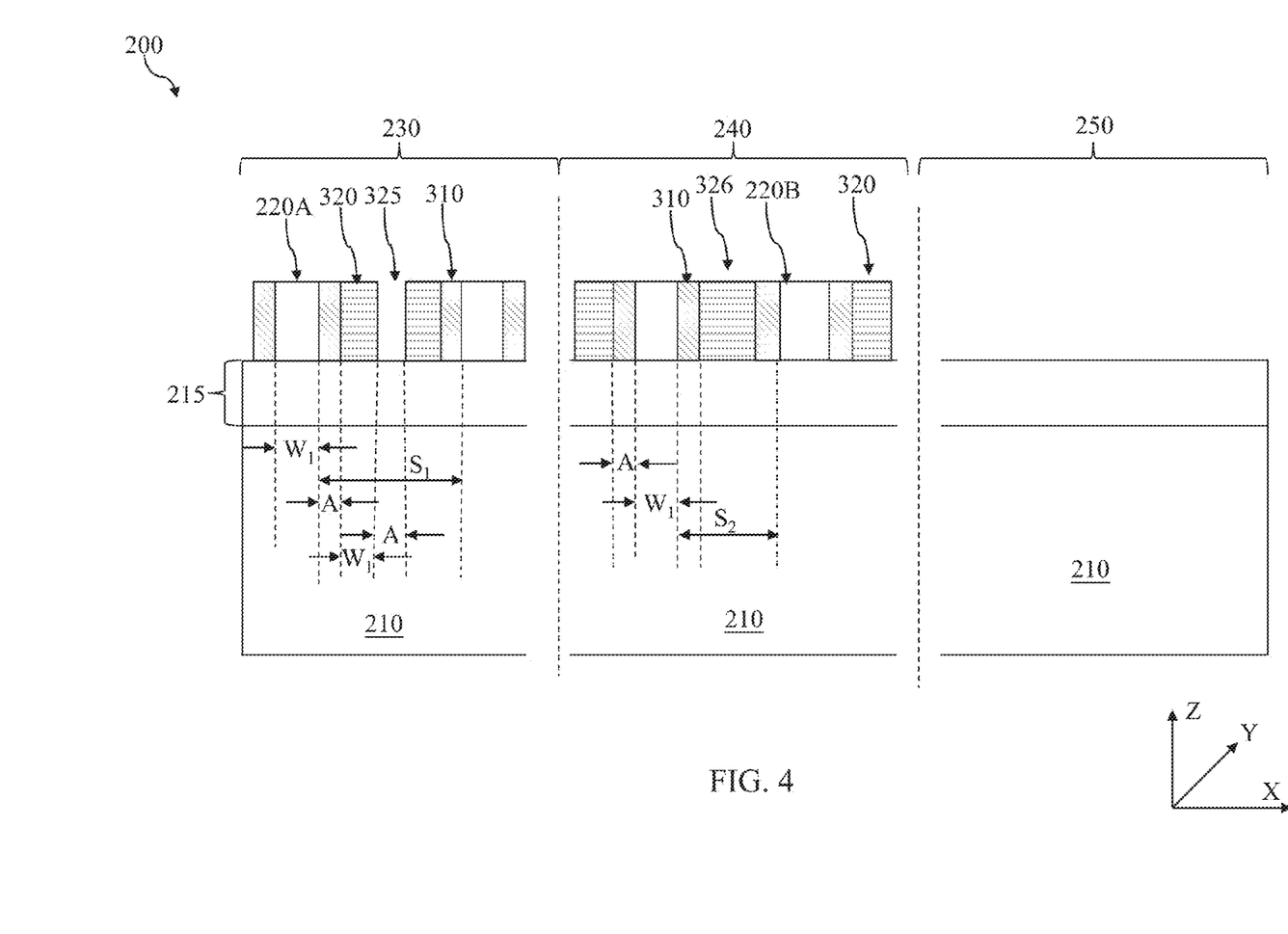

Referring to FIGS. 1 and 4, the method 100 proceeds to step 106 by forming a second spacer 320 on sidewalls of the first spacer 310. In one embodiment, the formation of the second spacer 320 includes depositing a second spacer material layer over the substrate 210 and the first spacer 310, and thereafter performing a second anisotropic etch to the second spacer material layer, thereby forming the second spacer 320. The second spacer material layer may include a dielectric material (such as silicon oxide, silicon nitride or silicon carbide) but is different from the first spacer material layer to achieve etching selectivity during the second anisotropic etch. In one embodiment, the second spacer material layer includes a same material layer as the mandrel feature 220. The deposition of the second spacer material layer includes a suitable technique, such as CVD. The second anisotropic etch may include a plasma etch in one example. The second spacer 320 is oriented in the Y direction and spaced from each other in the X direction. In the present embodiment, In the present embodiment, the second spacer 320 is formed to have the same width as the first spacing $W_1$. Therefore, in the first region 230, a gap 325 is left between two back-to-back second spacers 320, and a width of the gap 325 is about the same as the targeted width A. Also in the second region 240, the two back-to-back second spacers 320 merge with each other at a merging space 326.

Figure 5:
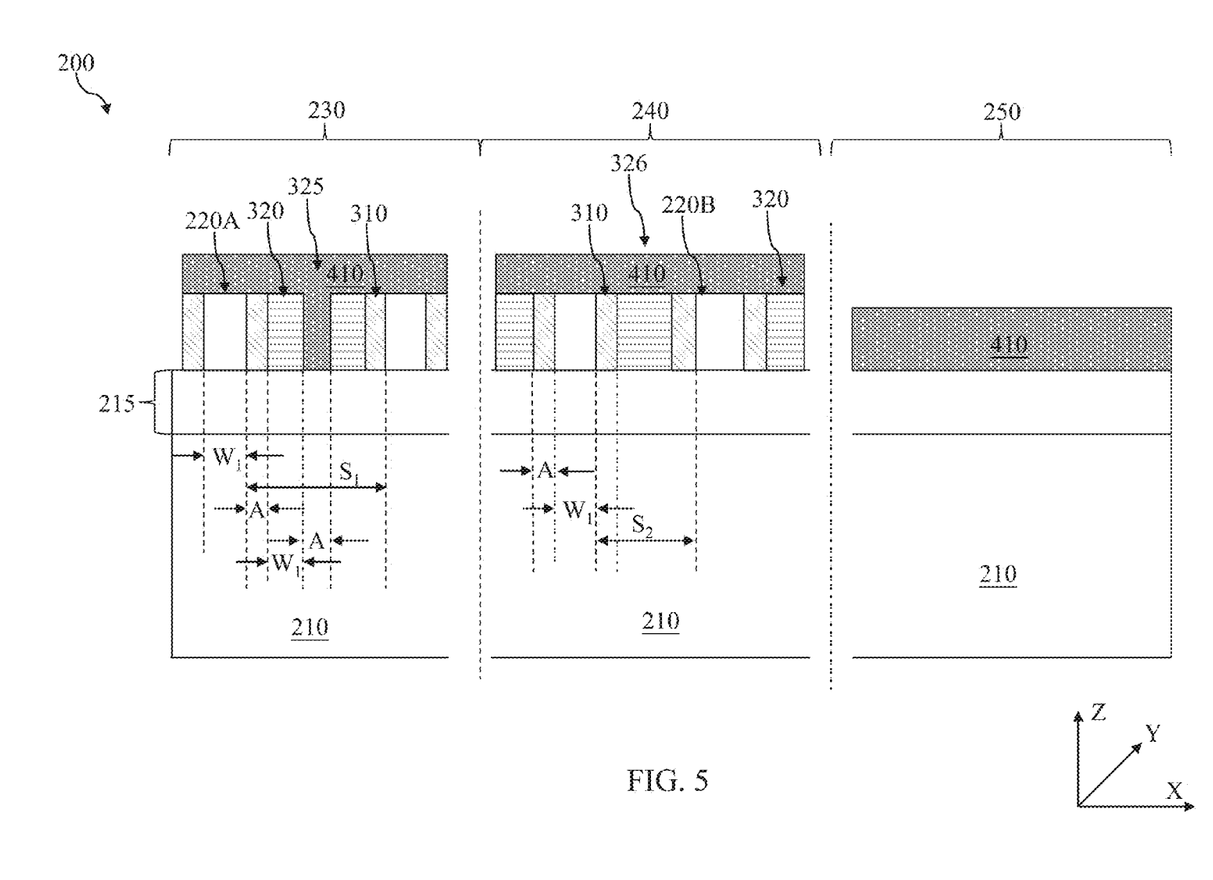

Referring to FIGS. 1 and 5, the method 100 proceeds to step 108 by depositing a dielectric layer 410 over the substrate 210, including fully filling in the gap 325. The dielectric layer 410 may include silicon oxide, silicon nitride, silicon carbide, or other suitable material. The dielectric layer 410 is deposited by a suitable technique, such as CVD and ALD. In one embodiment, the dielectric layer 410 has same dielectric material as the first spacer material to achieve etching selectivity in a subsequent etch, which will be described later.

Figure 6:
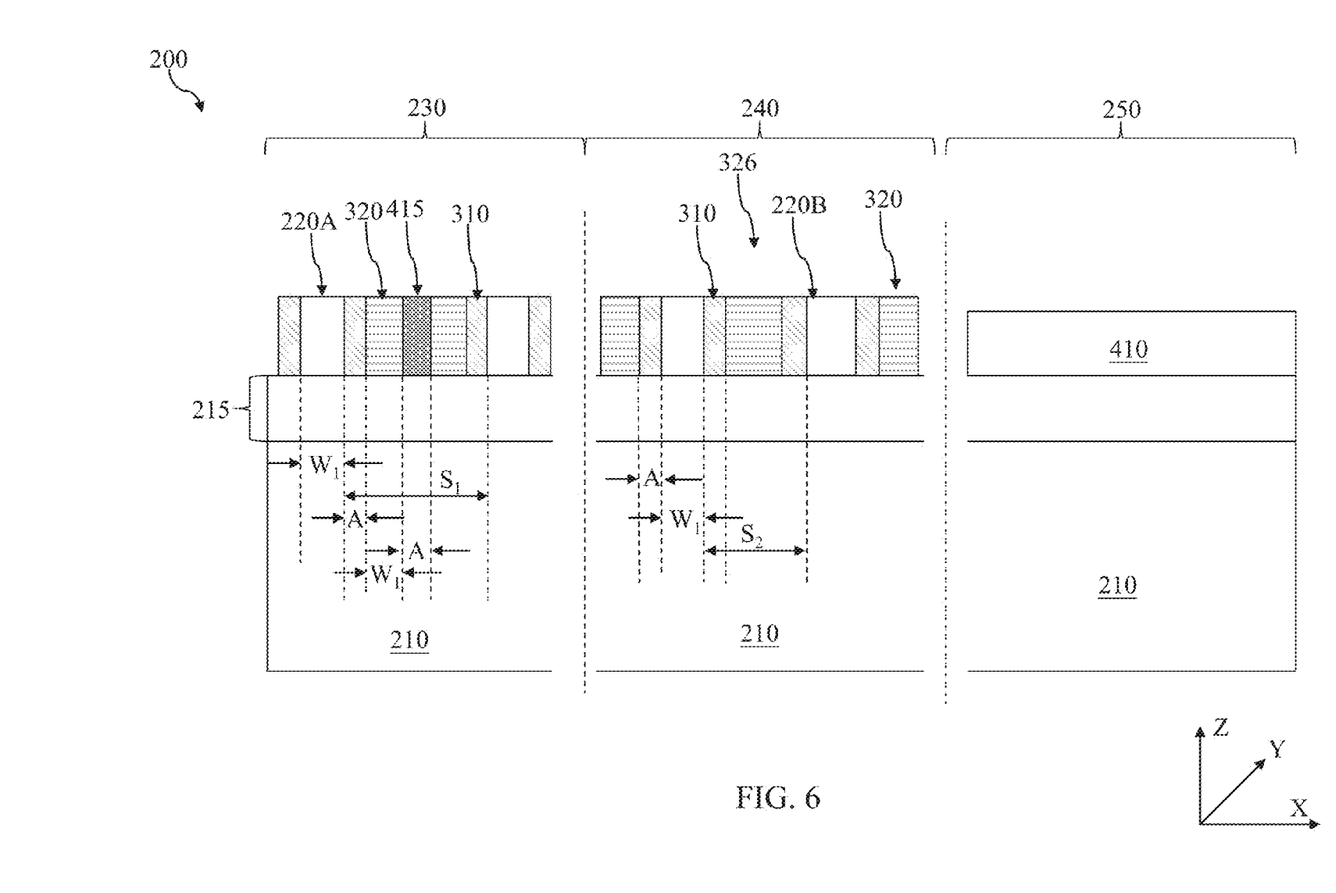

Referring to FIGS. 1 and 6, the method 100 proceeds to step 110 by etching back the dielectric layer 410 to expose top surfaces of the mandrel feature 220, the first spacer 310 and the second spacer 320 in the first and the second regions, 230 and 240. After etching back, a remaining portion of the dielectric layer 410 filled in the gap 325 forms a dielectric feature 415 and another remaining portion of the dielectric layer 410 covers the third region 250 as well. In one embodiment, the dielectric layer 410 is etched back by a chemical mechanical polishing (CMP) process.

Figure 7:
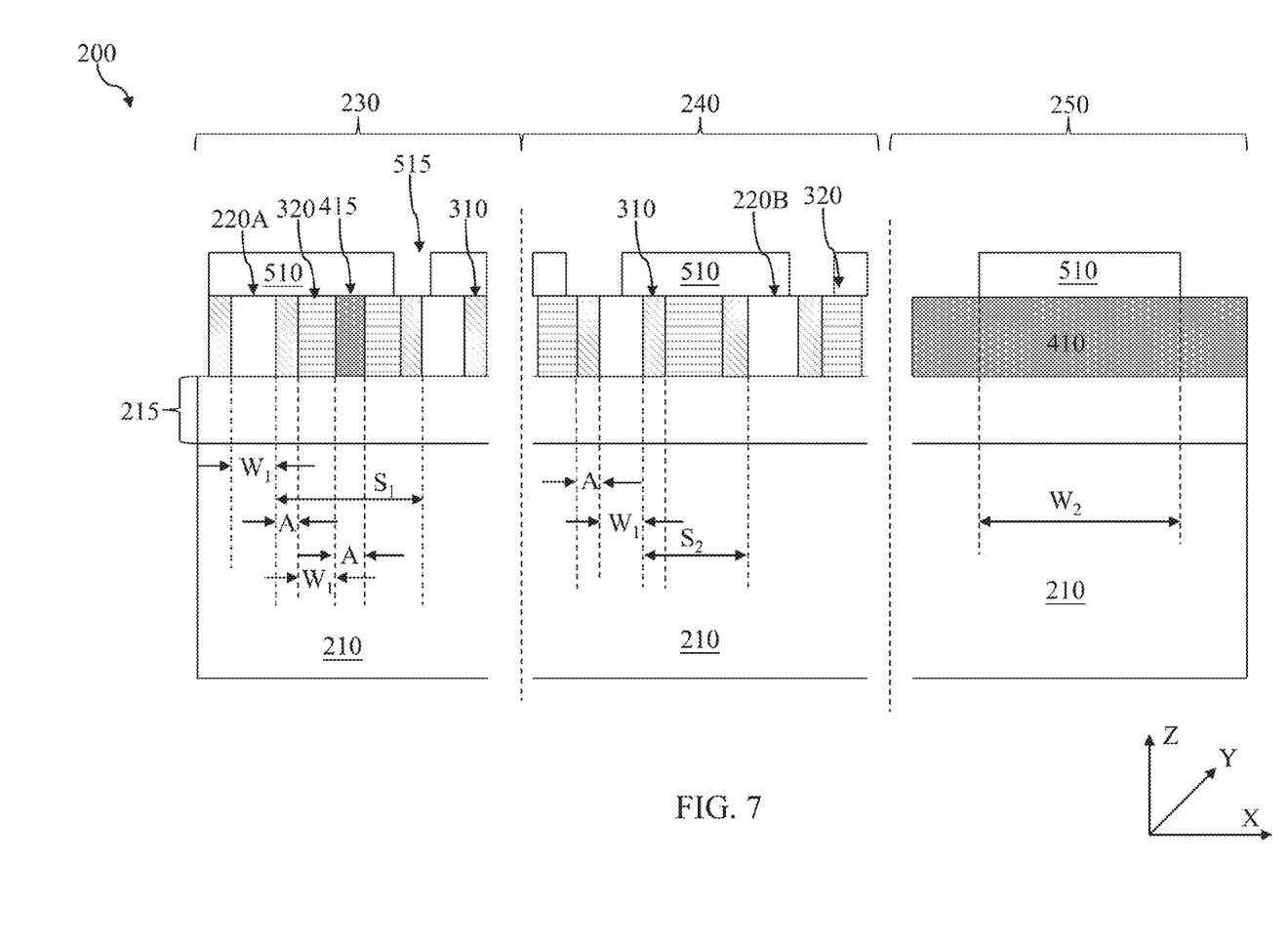

Referring to FIGS. 1 and 7, the method 100 proceeds to step 112 by forming a first cut pattern 510 having first openings 515, such that a first subset of the first spacers 310 within the first openings 515 are uncovered. Also in the third region 250, the first cut pattern 510 covers a portion of the dielectric layer 410 with a mesa width $W_2$. The mesa width $W_2$ is substantial larger than the first spacing $S_1$. In one embodiment, the mesa width $W_2$ defines a wide active region. In one embodiment, a subset of the second spacers 320 may be uncovered in the first openings 515 as well. The first cut pattern 510 is used as an etch mask during a subsequent etch process to selectively remove the first subset of the first spacer 310. The first cut pattern 510 may include a resist layer patterned by a second lithography process. Alternatively, the cut pattern 510 includes a hard mask material (dielectric material such as silicon oxide or silicon nitride) different from the first spacer material layer and the dielectric layer 410 to achieve etch selectivity and is patterned by a procedure that includes depositing a dielectric material layer, forming a resist pattern on the dielectric material layer, and etching the dielectric material layer using the resist pattern as an etch mask.

Figure 8:
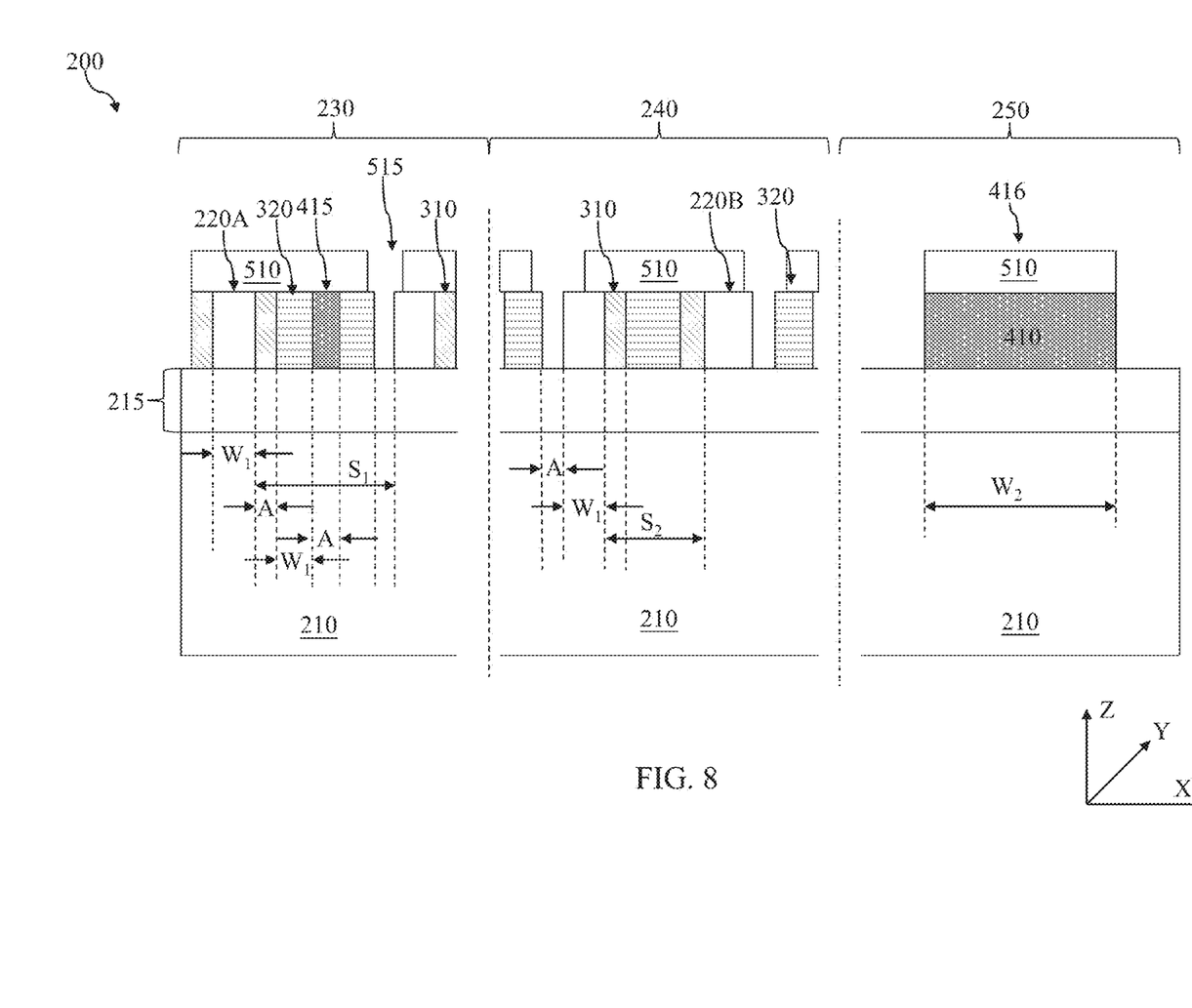

Referring to FIGS. 1 and 8, the method 100 proceeds to step 114 by performing a first cut to remove the first subset of the first spacer 310 and etch the dielectric layer 410 in the third region to form a dielectric mesa 416, through the first cut pattern 510. The first subset of the first spacer 310 (including the dielectric feature 415) and the dielectric layer 410 are removed by an etch process that selectively removes the first spacer material layer and the dielectric layer 410 but substantially does not etch the first cut pattern 510. In one embodiment, the etch process is configured to not etch the second spacer material layer as well during removing the first spacer 310 through the first cut pattern 510. Thereafter, the first cut pattern 510 is removed by a suitable process. In one example where the first cut pattern 510 is a resist pattern, the first cut pattern 510 is removed by wet stripping or plasma ashing. In another example wherein the cut pattern 510 is a hard mask pattern of a dielectric material, the cut pattern 510 may be removed by a wet etching process to selectively remove the hard mask material.

Figure 9:
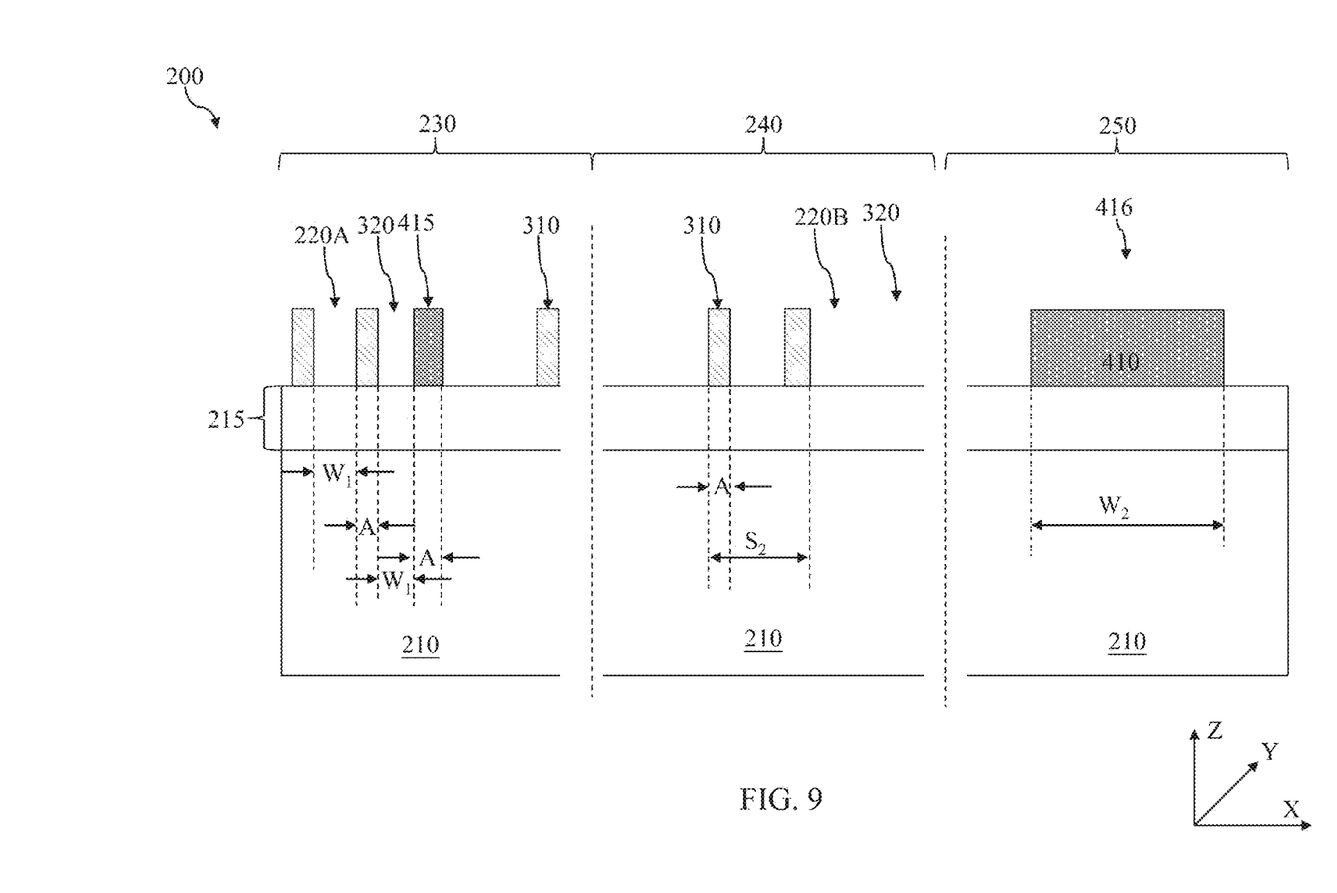

Referring to FIGS. 1 and 9, the method 100 proceeds to step 116 by removing the mandrel features 220 and the second spacers 320. In one embodiment, the mandrel features 220 and the second spacers 320 are removed by a selective etch process. The etch process selectively removes the mandrel features 220 and the second spacers 320, but substantially does not etch the first spacers 310, the dielectric features 415 and the dielectric mesa 416. The etch process may include a dry etching, a wet etching, and/or a combination thereof.

Figure 10:
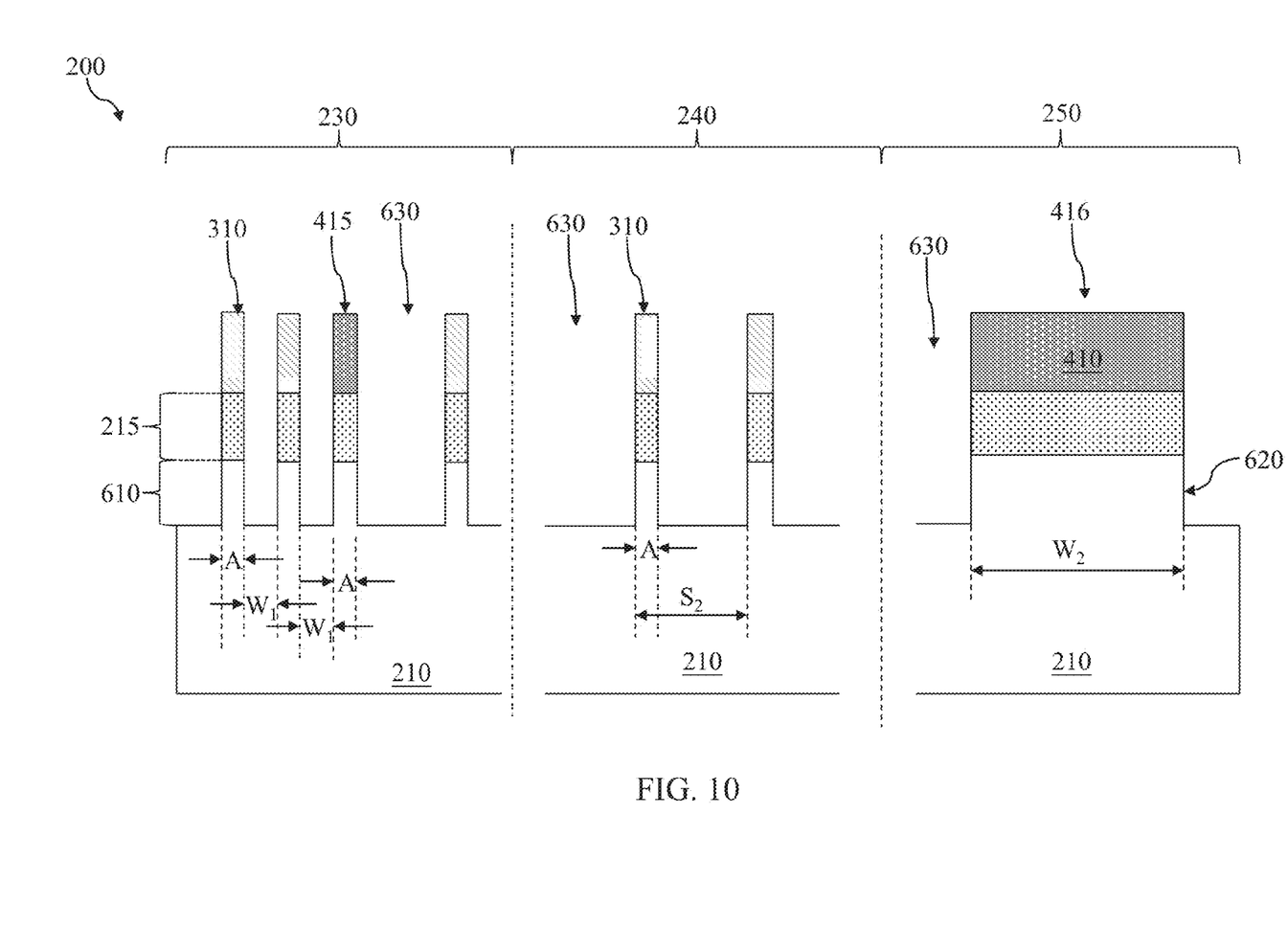

Referring to FIGS. 1 and 10, the method 100 proceeds to step 118 by etching the substrate 210 to form fins 610, a substrate mesa 620 and a first trench 630. In one embodiment, by using the first spacer 310, the dielectric feature 415 and the dielectric mesa 416 as an etch mask, a selective etch is performed to remove a portion of the substrate 210 to form the fins 610 having the targeted width A, the substrate mesa 620 having the mesa width $W_2$ and the first trench 630. The selective etch process may include a selective wet etch or a selective dry etch. A wet etching solution includes a tetramethylammonium hydroxide (TMAH), a $HF/HNO_3/CH_3COOH$ solution, or other suitable solution. Dry etching processes include a biased plasma etching process that uses a chlorine-based chemistry. Other dry etchant gasses include $CF_4$, $NF_3$, $SF_6$, and He. The etch process may include multiple etch steps to optimize the etch effect. In another embodiment, the fins 610 are formed having a width less than the targeted width A by a trimming the fins 610 further.

Figure 11:
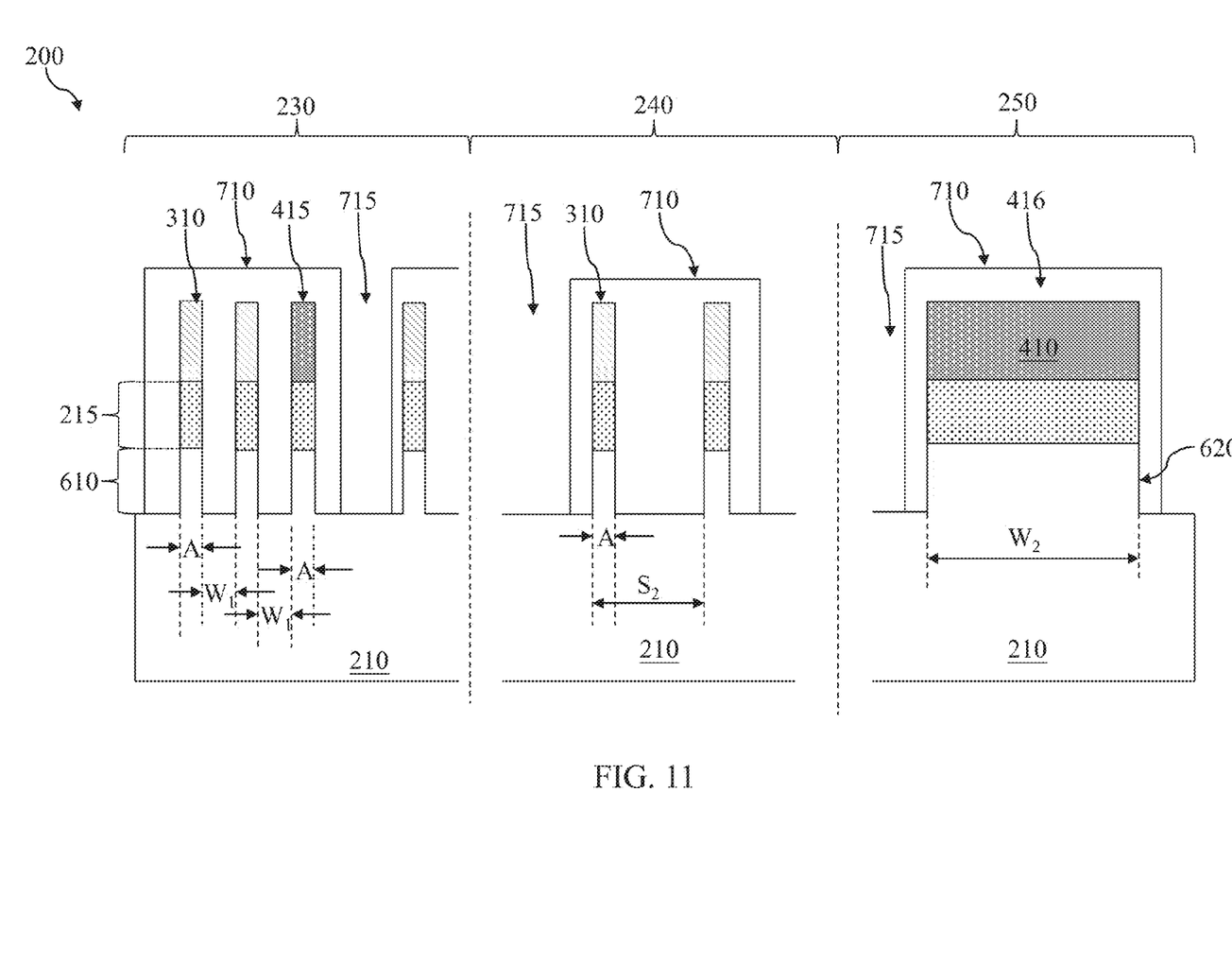

Referring to FIGS. 1 and 11, the method 100 proceeds to step 120 by forming a second cut pattern 710 having second openings 715 such that a second subset of the first spacer 310 (not shown) within the second openings 715 are uncovered. The second cut pattern 710 may be formed similarly in many respects to the first cut pattern 510 discussed above in association with FIG. 7. In one embodiment, the second cut pattern 710 is along a direction which is perpendicular to the direction of first cut pattern 510.

Figure 12:
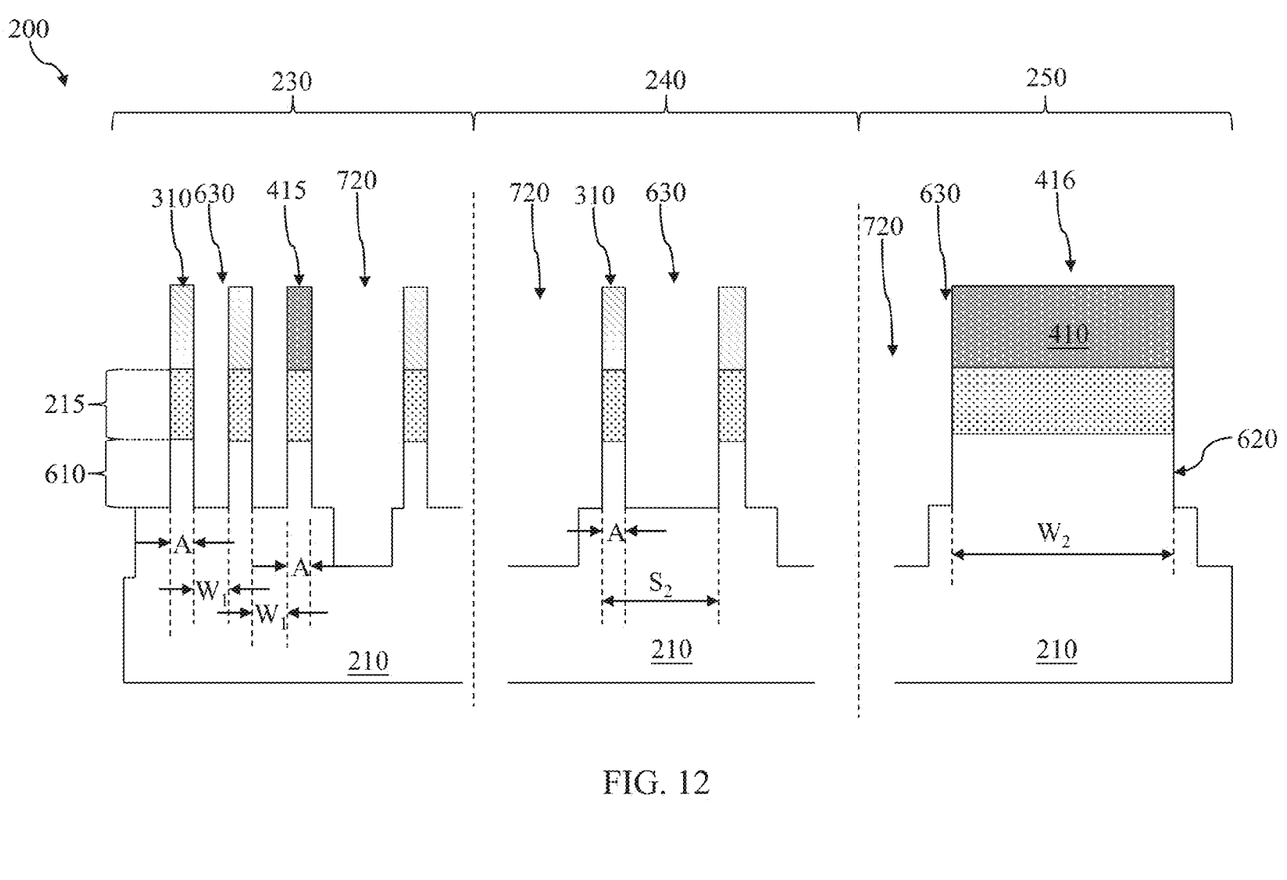

Referring to FIGS. 1 and 12, the method 100 proceeds to step 122 by performing a second cut to remove the second subset of the first spacers 310 and a portion of the substrate 210 through the second cut pattern 710, to form a second trench 720. In one embodiment, the second trench 720 is deeper than the first trench 630. The second cut may be performed by a suitable etch process, such as a wet etch, a dry etch, or a combination thereof. Thereafter, the second cut pattern 710 is removed by a suitable process.

Figure 13:
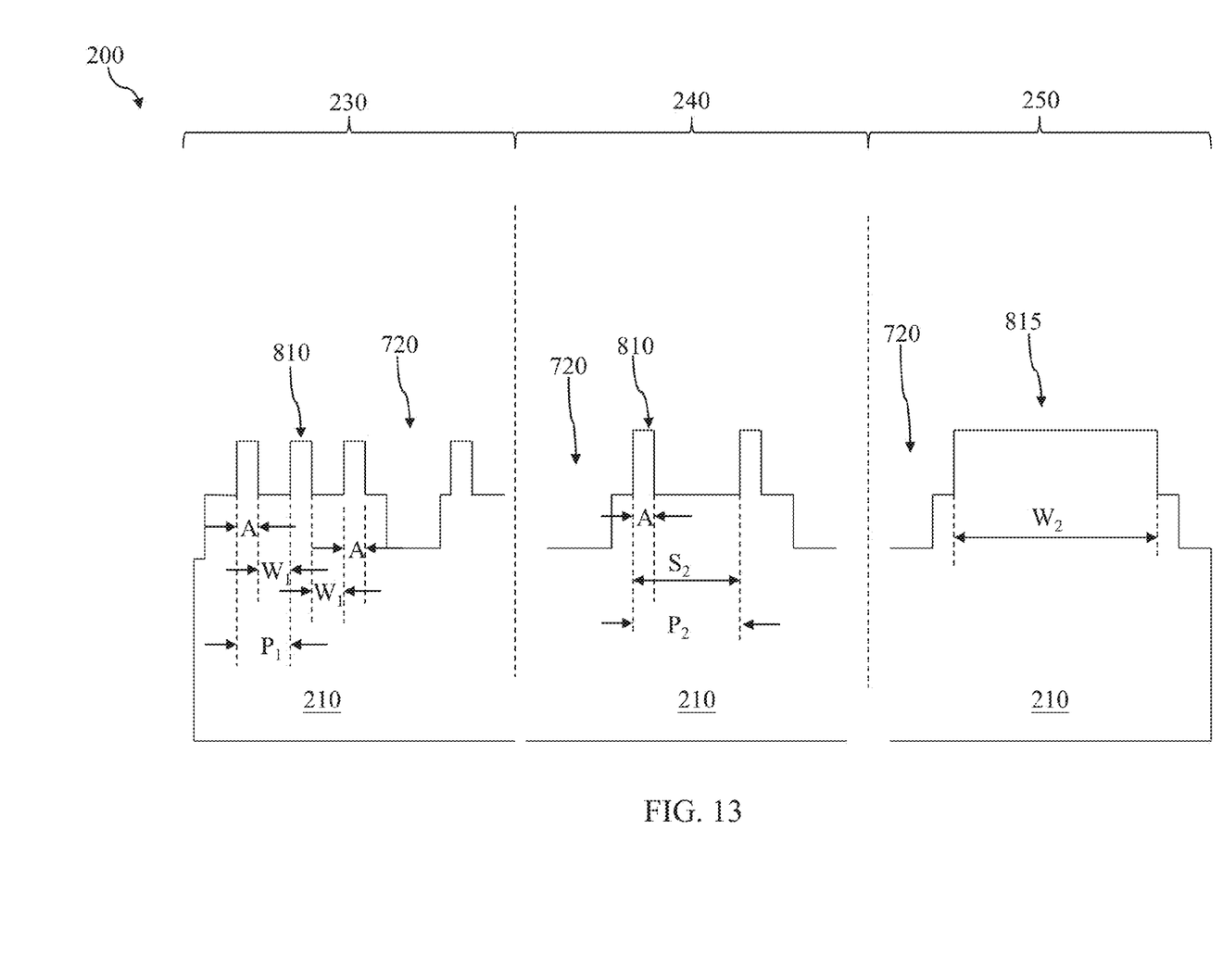

Referring to FIGS. 1 and 13, the method 100 proceeds to step 124 by removing the first spacer 310, the first dielectric feature 415 and the dielectric mesa 416 to reveal fins, now labeled with the reference number 810 having the first spacer width a, and a substrate mesa 815 having the mesa width $W_2$. The first spacer 310, the first dielectric feature 415, and the second dielectric feature 416 may be removed by a suitable etch process, such as a selective wet etch, a selective dry etch, or a combination thereof.

In the present embodiment, in the first region 240, a first pitch $P_1$ is equal to $A+W_1$. In the second region 240, a second pitch $P_2$ is equal to the second spacing $S_2$. The pitch is a dimension from an edge of one fin 810 to the same edge of an adjacent fin 810. Different pitches may be needed for different device components, such as an input/output component, a logic circuit, or a static random-access memory (SRAM).

Additional steps can be provided before, during, and after the method 100, and some of the steps described can be replaced or eliminated for other embodiments of the method.

The FinFET device 200 undergoes further CMOS or MOS technology processing to form various features and regions. The FinFET device 200 may include a high-k (HK)/metal gate (MG) over the substrate 210, including wrapping over a portion of the fins 810 in a gate region, where the fins 810 may serve as gate channel region. In a gate first process scheme, the HK/MG is all or part of a functional gate. Conversely, in a gate last process scheme, a dummy gate is formed first and is replaced later by the HK/MG after high thermal temperature processes are performed, such as thermal processes during sources/drains formation.

The FinFET device 200 may include isolation features formed by filling in the first and second trenches 630 and 720 with an isolation dielectric layer. The isolation dielectric layer may include silicon oxide, silicon nitride, silicon oxynitride, or other suitable materials, or combinations thereof. In some examples, the isolation dielectric layer has a multi-layer structure.

The FinFET device 200 may also include a source/drain feature in a source/drain regions in the substrate 210, including in another portion of the fins 810. As an example, a portion of the fins 810 in the source/drain regions is recessed first. Then, a semiconductor material epitaxially grows in the recessed portion of the fins 810 to form the source/drain feature. The semiconductor material includes Ge, Si, GaAs, AlGaAs, SiGe, GaAsP, or other suitable material.

The FinFET device 200 may also include an interlayer dielectric (ILD) layer formed between the HK/MG over the substrate 210. The ILD layer includes silicon oxide, oxynitride or other suitable materials. The ILD layer includes a single layer or multiple layers.

The FinFET device 200 may also includes various contacts/vias/lines and multilayers interconnect features (e.g., metal layers and interlayer dielectrics) over the substrate 210. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, the present disclosure offers a method for fabricating a FinFET device. The method employs a scheme of forming mandrel features, first spacers, and second spacers to achieve forming different pitches. The method also employs forming a dielectric feature with a same width as a fin to gain additional fins. The method also employs forming a wide substrate mesa during performing a first cut. The method provides an integration of forming fins and pitches with big flexibility.

The present disclosure provides many different embodiments of fabricating a semiconductor device that provide one or more improvements over existing approaches. In one embodiment, a method for fabricating an integrated circuit includes providing a substrate with a first region, a second region and a third region, and a targeted width A. The method also includes forming a plurality of mandrel features in the first and the second regions. The mandrel features are formed such that: in the first region, the mandrel feature has a first width $W_1$ and a first spacing $S_1$ between two adjacent mandrel features. The first spacing $S_1$ is set to be equal to $(2 \times W_1)+(3 \times A)$, in the second region, the mandrel feature has the first width $W_1$ and a second spacing $S_2$ between two adjacent mandrel features, wherein $S_2$ is set to be smaller than $(2 \times W_1)+(2 \times A)$ and larger than $(2 \times A)$. The method also includes forming a first spacer along sidewalls of the mandrel feature, forming a second spacer along sidewalls of the first spacer. Two back-to-back adjacent second spacers separate by a gap in the first region and merge together in the second region. The method also includes depositing a dielectric layer over the substrate, including the mandrel features, the first and the second spacers, forming a dielectric feature in the gap, performing a first cut to remove a first subset of the first spacer and at the same time forming a dielectric mesa in the third region. The method also includes removing the mandrel features and the second spacers and etching the substrate using the first spacer, the dielectric feature and the dielectric mesa as an etch mask.

In another embodiment, a method for fabricating a FinFET device includes providing a substrate having first, second and third regions and a targeted width A for a to-be-made fin. The method also includes forming a plurality of mandrel features in the first region and the second regions. The mandrel features are formed such that: in the first region, the mandrel feature has a first width $W_1$ and a first spacing $S_1$ between two adjacent mandrel features. The $S_1$ is set to be equal to $(2 \times W_1)+(3 \times A)$, in the second region, the mandrel feature has the first width $W_1$ and a second spacing $S_2$ between two adjacent mandrel features. The $S_2$ is set to be smaller than $(2 \times W_1)+(2 \times A)$ and larger than $(2 \times A)$, The method also includes forming first spacers along sidewalls of the mandrel feature with the targeted width A, forming second spacers along sidewalls of the first spacers such that: in the first region, a gap with the targeted width A is left between two back-to-back second spacers and in the second region, two back-to-back second spacers are merged together. The method also includes depositing a dielectric layer over the substrate, including fully filling in the gap, recessing the dielectric layer to form a dielectric feature in the gap. The dielectric feature is formed with a same width as the targeted width A. The method also includes performing a first cut to remove a first subset of the first spacers, coincident with removing the first subset of the first spacers, forming a dielectric mesa in the third region. The dielectric mesa has a second width $W_2$, which is substantial larger than the first width $W_1$. The method also includes removing the mandrel features and the second spacers, etching the substrate using the first spacers, the dielectric features as an etch mask to form fins, coincident with etching the substrate to form fins, etching the substrate using the dielectric mesa as an etch mask to form a substrate mesa and performing a second cut to remove a subset of the fins to form an isolation trench.

In yet another embodiment, a method for fabricating an integrated circuit includes providing a substrate having a first region and a second region, forming mandrel features in the first region, forming a first spacer on sidewalls of the mandrel features, forming a second spacer on sidewalls of the first spacer such that two adjacent second spacers are separated by a gap which having same width as the first spacer, depositing a dielectric layer over the substrate, including fully filling in the gap, recessing the dielectric layer to form a dielectric feature in the gap, forming a pattern resist layer to expose a subset of the first spacer and a portion of the dielectric layer in the second region, performing an etch through the pattern resist layer to remove the subset of the first spacer and form a dielectric mesa in the third region, removing the mandrel features and the second spacers and etching the substrate using the first spacer, the dielectric feature and the dielectric mesa as an etch mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making an integrated circuit (IC), the method comprising:
   providing a substrate having a first region and a second region;
   forming a plurality of mandrel features in the first region with a first spacing;
   forming first spacers along sidewalls of the mandrel features with a targeted width A;
   forming second spacers with a first width $W_1$ along sidewalls of the first spacers, wherein two back-to-back adjacent second spacers are separated by a gap;
   depositing a dielectric material in the gap and in the second region;
   performing a first cut thereby removing a first subset of the first spacers; and
   coincident with the removing of the first subset, partially removing the dielectric material in the second region thereby forming a mesa of the dielectric material in the second region.

2. The method of claim 1, wherein a width of the gap is about the same as the targeted width A.

3. The method of claim 1, wherein the first spacing is about equal to $(2 \times W_1) + (3 \times A)$.

4. The method of claim 1, wherein the mesa has a second width $W_2$ substantially larger than the first width $W_1$.

5. The method of claim 1, wherein the mandrel features each have a width about the same as $W_1$.

6. The method of claim 1, wherein the depositing of the dielectric material includes:
   depositing the dielectric material over the substrate and filling in the gap; and
   recessing the dielectric material to expose top surfaces of the mandrel features.

7. The method of claim 6, wherein the recessing of the dielectric material is by a chemical mechanical polishing (CMP) process.

8. The method of claim 1, wherein the removing of the first subset and the partially removing of the dielectric material are performed with the same cut pattern.

9. The method of claim 1, further comprising:
   removing the mandrel features and the second spacers; and
   etching the substrate using at least a portion of the first spacers and the mesa as an etch mask.

10. The method of claim 9, further comprising:
    after the etching of the substrate, forming a second cut pattern with openings to expose a second subset of the first spacers; and
    performing a second cut to remove the second subset of the first spacers to form an isolation trench in the substrate.

11. The method of claim 10, wherein the second cut is in a direction which is perpendicular to the first cut.

12. The method of claim 1, wherein the first spacers and the dielectric material are of the same material.

13. The method of claim 1, wherein the second spacers and the mandrel features are of the same dielectric material that is different from the first spacer material.

14. A method for fabricating a fin-type field-effect transistor (FinFET) device, the method comprising:
providing a substrate having a first region and a second region;
forming a plurality of mandrel features in the first region with a first spacing;
forming first spacers along sidewalls of the mandrel features with a targeted width A;
forming second spacers with a first width $W_1$ along sidewalls of the first spacer, wherein two back-to-back adjacent second spacers are separate by a gap;
forming a first dielectric feature in the gap and a second dielectric feature in the second region;
performing a first cut thereby removing a first subset of the first spacers;
coincident with the removing of the first subset, removing a portion of the second dielectric feature thereby forming a dielectric mesa with a second width $W_2$ in the second region, wherein the second width $W_2$ is substantially larger than the first width $W_1$;
removing the mandrel features and the second spacers;
etching the substrate using at least a portion of the first spacers and the first dielectric feature as an etch mask to form fins; and
coincident with the etching of the substrate to form fins, etching the substrate using the mesa as an etch mask to form a substrate mesa.

15. The method of claim 14, further comprising:
performing a second cut to remove a subset of the fins to form an isolation trench, wherein the second cut is in a direction which is perpendicular to the first cut.

16. The method of claim 14, wherein:
the mandrel features and the second spacers are of a first material; and
the first spacers and the first and second dielectric features are of a second material that is different from the first material.

17. The method of claim 14, wherein:
a width of the gap is about the same as the targeted width A;
the first spacing is about equal to $(2 \times W_1)+(3 \times A)$; and
the mandrel features each have a width about the same as $W_1$.

18. A method for integrated circuit (IC), comprising:
providing a substrate having a first region and a second region;
forming mandrel features in the first region;
forming first spacers on sidewalls of the mandrel feature;
forming second spacers on sidewalls of the first spacer such that two adjacent second spacers are separated by a gap having the same width as the first spacer;
depositing a dielectric layer over the substrate, including fully filling in the gap;
recessing the dielectric layer to form a first dielectric feature in the gap and a second dielectric feature in the second region;
forming a patterned resist layer to expose a subset of the first spacer and a portion of the second dielectric layer;
etching through the patterned resist layer to remove the subset of the first spacer and the portion of the second dielectric layer thereby forming a dielectric mesa in the second region; and
removing the mandrel features and the second spacers.

19. The method of claim 18, further comprising:
etching the substrate using a portion of the first spacers, the first dielectric feature, and the mesa as an etch mask.

20. The method of claim 18, wherein:
the mandrel features each have a width $W_1$;
the second spacers each have a width about $W_1$;
the gap has a width A; and
the mandrel features have a spacing S, wherein S is about equal to $(2 \times W_1)+(3 \times A)$.

* * * * *